US011938838B2

(12) United States Patent
Simonis et al.

(10) Patent No.: US 11,938,838 B2
(45) Date of Patent: Mar. 26, 2024

(54) METHOD AND DEVICE FOR THE ROBUST PREDICTION OF THE AGING BEHAVIOR OF AN ENERGY STORAGE UNIT IN A BATTERY-OPERATED MACHINE

(71) Applicant: Robert Bosch GmbH, Stuttgart (DE)

(72) Inventors: Christian Simonis, Leonberg (DE); Christoph Woll, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 44 days.

(21) Appl. No.: 17/487,895

(22) Filed: Sep. 28, 2021

(65) Prior Publication Data
US 2022/0097561 A1    Mar. 31, 2022

(30) Foreign Application Priority Data
Sep. 29, 2020    (DE) ...................... 10 2020 212 297.0

(51) Int. Cl.
*B60L 58/16*    (2019.01)
*G01R 31/367*    (2019.01)
(Continued)

(52) U.S. Cl.
CPC ............ *B60L 58/16* (2019.02); *G01R 31/367* (2019.01); *G01R 31/392* (2019.01); *G06N 7/01* (2023.01); *G06N 20/00* (2019.01); *G07C 5/0808* (2013.01)

(58) Field of Classification Search
CPC ...... B60L 58/16; B60L 50/20; B60L 2200/12; B60L 2260/44; B60L 2260/46;
(Continued)

(56) References Cited

U.S. PATENT DOCUMENTS

2008/0071484 A1* 3/2008 Koch ...................... G01R 31/36
702/63
2008/0165592 A1    7/2008 Kitagawa et al.
(Continued)

FOREIGN PATENT DOCUMENTS

CN           106125004 A   * 11/2016   ........... G01R 31/367
DE    10 2018 131 626 A1    6/2019
EP        3 224 632 B1    4/2019

OTHER PUBLICATIONS

"Review of Hybrid Prognostics Approaches for Remaining Useful Life Prediction of Engineered Systems, and an Application to Battery Life Prediction", Linxia Liao et al, IEEE Transactions On Reliability, vol. 63, No. 1., (Year: 2014).*

(Continued)

*Primary Examiner* — Catherine T. Rastovski
*Assistant Examiner* — Lal C Mang
(74) *Attorney, Agent, or Firm* — Maginot, Moore & Beck LLP

(57) ABSTRACT

A method for determining a predicted state of health of an electrical energy storage unit in a machine includes providing a data-based or hybrid state of health model, the data-based state of health model is trained, depending on operating variables of the electrical energy storage unit and/or operating features derived from the operating variables, to indicate a state of health and to indicate a model uncertainty of the indicated state of health, ascertaining a state of health characteristic and the associated model uncertainty of the energy storage unit based on the operating variables using the state of health model, and generating at least one random constructed state of health characteristic candidate that corresponds to constructed state of health characteristics within characteristic of confidence intervals, the characteristic of confidence intervals defined by the model uncertainties of (Continued)

the states of health of the ascertained state of health characteristic.

15 Claims, 4 Drawing Sheets

(51) Int. Cl.
*G01R 31/392* (2019.01)
*G06N 7/01* (2023.01)
*G06N 20/00* (2019.01)
*G07C 5/08* (2006.01)

(58) Field of Classification Search
CPC . B60L 2260/50; G01R 31/367; G01R 31/392; G06N 7/005; G06N 20/00; G07C 5/0808; H02J 2310/48; H02J 7/005; Y02T 10/70
See application file for complete search history.

(56) References Cited

U.S. PATENT DOCUMENTS

2017/0214255 A1* 7/2017 Hartmann ........... H01M 10/441
2018/0165592 A1* 6/2018 Huang ................... G06N 7/005

OTHER PUBLICATIONS

Liao L. et al., "Review of Hybrid Prognostics Approaches for Remaining Useful Life Prediction of Engineered Systems, and an Application to Battery Life Prediction", IEEE Transactions on Reliability, vol. 63, No. 1, Mar. 2014, pp. 191-207.

* cited by examiner

METHOD AND DEVICE FOR THE ROBUST PREDICTION OF THE AGING BEHAVIOR OF AN ENERGY STORAGE UNIT IN A BATTERY-OPERATED MACHINE

This application claims priority under 35 U.S.C. § 119 to patent application no. DE 10 2020 212 297.0, filed on Sep. 29, 2020 in Germany, the disclosure of which is incorporated herein by reference in its entirety.

FIELD

The disclosure relates to battery-operated machines, such as electrically drivable motor vehicles, in particular electric vehicles or hybrid vehicles, and also to measures for determining a state of health (SOH) of an electrical energy storage unit for a battery-operated machine.

BACKGROUND

Energy is supplied to battery-operated machines and devices, such as in particular electrically drivable motor vehicles, using an electrical energy storage unit, such as for example a vehicle battery. This supplies electrical energy in order to operate machine systems. The state of health of the electrical energy storage unit worsens noticeably over the course of its service life, this resulting in a decreasing maximum storage capacity. A degree of the aging of the electrical energy storage unit depends on individual loading of the energy storage unit, that is to say on the usage behavior of a user, and on the type of energy storage unit.

Although a physical aging model may be used to determine the present state of health based on historical operating variable characteristics, this model is often highly inaccurate. This inaccuracy of the conventional aging model hampers prediction of the state of health characteristic. However, the prediction of the characteristic of the state of health of the energy storage unit is an important technical variable, since it allows a financial assessment of a residual value of the energy storage unit.

SUMMARY

According to the disclosure, provision is made for a method for determining a predicted state of health of an electrical energy storage unit in a battery-operated machine, in particular an electrically drivable motor vehicle, and a device and a battery-operated.

According to a first aspect, provision is made for a method for determining a predicted state of health of an electrical energy storage unit in a battery-operated machine, in particular in an electrically drivable motor vehicle, comprising the following steps:

providing a data-based state of health model, wherein the data-based state of health model is trained, depending on operating variables of an energy storage unit and/or operating features derived from operating variables, to indicate a state of health and to indicate a model uncertainty of the indicated state of health;
  ascertaining a state of health characteristic and the associated model uncertainty of a particular energy storage unit on the basis of its operating variables using the state of health model;
  generating one or more random constructed state of health characteristic candidates that correspond to constructed state of health characteristics within a characteristic of confidence intervals, wherein the characteristic of the confidence intervals is defined by the model uncertainties of the states of health of the ascertained state of health characteristic;
  selecting, from a multiplicity of provided state of health characteristics of real energy storage units of other machines, a number of real state of health characteristics that are closest to the one or more state of health characteristic candidates;
  ascertaining a probability density of the selected real state of health characteristics, in particular through fitting, in order to obtain a confidence interval using which a predicted state of health characteristic is determined;
  signaling the predicted state of health characteristic and/or the accompanying calculated service life estimate.

The state of health of a rechargeable electrical energy storage unit, in particular a vehicle battery, is usually not measured directly. This would require a number of sensors in the energy storage unit and/or interventions in the energy storage unit, which would complicate the production of such an energy storage unit and increase the space requirement. Methods suitable for the automotive sector for determining the state of health in the machine are additionally not yet available on the market.

The current state of health is therefore generally ascertained using a physical aging model. This physical state of health model is inaccurate in certain situations and exhibits model errors of more than 5%. The inaccuracy of the physical aging model also means that it is able to indicate only the present state of health of the energy storage unit. There is no provision at present for predicting the state of health using a purely physical aging model that depends in particular on the mode of operation of the energy storage unit, such as for example on the value and amount of the charge inflow and charge outflow in the case of a battery, and thus on a usage behavior and on machine parameters.

The state of health (SOH) is the key variable for indicating a remaining performance of an energy storage unit, in particular a battery capacity or remaining battery charge. The state of health represents a degree of the aging of the energy storage unit and may be indicated, in the case of a battery, as a capacity retention rate (SOH-C) or as a rise in internal resistance (SOH-R). The capacity retention rate SOH-C is indicated as a ratio of the measured present capacity to an initial capacity of the fully charged battery. The relative change in internal resistance SOH-R rises as the battery ages.

It is possible in principle, by predicting the characteristic of the state of health of the battery, in particular using an appropriate data-based state of health model based on fleet data, to determine when a target value of the state of health or a remaining service life of zero is reached. This may be signaled to a user in order to prompt said user to exchange the energy storage unit of the machine or the battery. It is also helpful to indicate the remaining service life in order to identify or to estimate early on whether a guaranteed overall service life of the battery is complied with in accordance with the manufacturer specifications.

The above method uses a user-specific and machine-specific prediction of a state of health of the battery of a particular machine based on a data-based state of health model. The data-based state of health model may also comprise hybrid models (physical, for example electrochemical model, combined with supervised learning algorithms). The data-based state of health model is implemented outside the machine in a central processing unit that has a communication connection to a multiplicity of machines. The data-based state of health model may thus be created using evaluated fleet data and improved noticeably and provide modeled states of health that are ascertained on the basis of a large database simultaneously for all machines (in the case of vehicles, the individual vehicles of the vehicle fleet are referred to as machines).

The data-based state of health model may be formed using a probabilistic regression model, in particular a Gaussian process model, or a Bayesian neural network, or comprise same. Such models have the property of also being able to indicate/provide a model uncertainty in addition to a predicted value/model value. The model uncertainty expresses for example the reliability/confidence of the state value calculated by the model. If the model uncertainty is high, then the use of the calculated value of the state of health model for the evaluation point in question initially tends to be unreliable.

In order nevertheless to allow a best possible prediction of a future state of health, the data-based state of health model present in the central processing unit (cloud) may be used statistically in order to allow a most probable predicted state of health characteristic for a particular energy storage unit based on machine-specific operating features of the energy storage unit. It may thereby be ensured that, when predicting the state of health characteristic, not only the model value of the state of health model but also the associated model uncertainty in combination with domain knowledge is taken into consideration and evaluated in order to improve the prediction accuracy.

The operating states of the energy storage unit are determined from the operation of the energy storage unit in the machine using temporal characteristics of operating variables. For a respective evaluation period, the temporal characteristics of the operating variables, such as for example the characteristics of the battery current, the battery voltage, the battery temperature and the state of charge, are characterized by operating features. The operating features thus characterize use of the battery in the evaluation period and also accumulated use over the previous service life of the energy storage unit. All of the operating features for an energy storage unit (operating feature point) determine the input data of the data-based state of health model or the evaluation point for which the data-based state of health model is evaluated.

The prediction of the future state of health may be achieved using Monte Carlo simulations in the form of statistical process modeling that is linked to a nearest neighbor prediction that operates based on similarity characteristics of the energy storage units of the other machines. A large number of possible real state of health characteristics are thereby able to be determined and used to predict a realistic, most likely machine-specific state of health characteristic.

The above method for ascertaining a predicted state of health characteristic, due to the linking of the Monte Carlo method of randomly selecting state of health characteristic candidates within the confidence interval of the state of health characteristic of the particular energy storage unit and the subsequent selection of real state of health characteristics that are closest to the state of health characteristic candidates, is highly robust, in particular in the case of model statements about the state of health model for which the state of health model is able to provide only a very noisy state of health indication, that is to say one impacted by high uncertainty. The real state of health characteristics correspond to state of health characteristics of real energy storage units, preferably those that have reached the end of their service life and for which there is an as far as possible long-term, reliable state of health characteristic, preferably over the entire service life.

The state of health characteristic candidates may furthermore be checked for plausibility before they are used to ascertain the probability density function, with implausible or physically infeasible state of health characteristic candidates not being taken into consideration for ascertaining the probability density function.

Provision may be made for the steps of generating the one or more state of health characteristic candidates and of selecting real state of health characteristics to be performed multiple times, wherein the selected real state of health characteristics are each added to an evaluation set, wherein the probability density function is ascertained depending on the selected real state of health characteristics of the evaluation set.

The steps may in particular be performed multiple times until a convergence criterion is met, wherein the convergence criterion depends on an overall confidence or a statistical significance that results from the iteration characteristic of the variance or the standard deviation of the probability density, wherein the convergence criterion depends in particular on a change in the overall confidence of all combined state of health characteristics in successive run-throughs of the generation and selection steps.

According to one embodiment, the selection of real state of health characteristics that are closest to the one or more state of health characteristic candidates may be performed using a nearest neighbor method, in particular using a least squares method, in a multidimensional operating feature space with respect to the temporal or usage-dependent characteristic of the respective state of health characteristic candidates. Real state of health characteristics are state of health characteristics of real energy storage units of other machines that are stored in a central processing unit.

In this case, the state of health characteristic candidates are compared, according to their historical state of health characteristic, with the real state of health characteristics in order to ascertain known, real aging trajectories that are similar to the state of health characteristic candidates ascertained through Monte Carlo sampling and then possibly physically checked for plausibility. This comparison may be performed in a multidimensional operating feature space, for example state of health characteristic over time, Ah throughput, mileage covered, etc. In this case, the n most similar known, real state of health characteristics are selected by solving the optimization problem, preferably using the least squares method, wherein n>0.

Furthermore, from the n selected known, real state of health characteristic candidates, all of the aging information up to the end of their service life, which gives an indication about a previous service life (period between putting into service and present evaluation period) with corresponding time intervals may be used for the prediction and to determine the remaining service life and predict the aging of all energy storage units.

The predicted state of health characteristic may furthermore be transferred to the battery-operated machine, with this being operated depending on the predicted state of health characteristic.

Provision may be made for the predicted state of health characteristic to be used to ascertain a remaining service life with statistical uncertainty quantification and to use or to signal this in subsequent methods for outputting driving recommendations.

The predicted state of health characteristic may furthermore be used in order to signal an exchange of the vehicle battery when a remaining service life of zero is reached, this usually being defined by the SOH (for example through service life specification: SOHC>=80% for 8 years). When a predicted probability of infringement of the service life specification exceeds a predefined probability threshold (for example 80%), wherein the prediction probability is calculated by integrating over the probability density function with respect to the remaining service life.

Provision may be made for a probability density to be ascertained by adding histograms of states of health, predicted stochastically at each evaluation time, of the selected real state of health profiles.

According to a further aspect, provision is made for a device for determining a predicted state of health of an electrical energy storage unit in a battery-operated machine, in particular an electrically drivable motor vehicle, wherein the device is designed for:

providing a data-based state of health model, wherein the data-based state of health model is trained, depending on operating variables of an energy storage unit and/or operating features derived from operating variables, to indicate a state of health and to indicate a model uncertainty of the indicated state of health;

ascertaining a state of health characteristic and the associated model uncertainty of a particular energy storage unit on the basis of its operating variables using the state of health model;

generating one or more random constructed state of health characteristic candidates that correspond to constructed state of health characteristics within a characteristic of confidence intervals, wherein the characteristic of the confidence intervals is defined by the model uncertainties of the states of health of the ascertained state of health characteristic;

selecting a number of real state of health characteristics that are closest to the one or more state of health characteristic candidates from a multiplicity of provided state of health characteristics of real energy storage units of other machines;

ascertaining a probability density of the selected real state of health characteristics, in particular through fitting, in order to obtain a confidence interval using which a predicted state of health characteristic is determined; and signaling the predicted state of health characteristic.

BRIEF DESCRIPTION OF THE DRAWINGS

Embodiments are explained in more detail below with reference to the appended drawings, in which.

DETAILED DESCRIPTION

The method according to the disclosure is described below on the basis of vehicle batteries as electrical energy storage units in a multiplicity of motor vehicles as battery-operated machines. For other electrical energy storage units, such as for example fuel cells, the method described below may be applied in a comparable manner. A data-based state of health model for the respective vehicle battery may be implemented in a control unit in the motor vehicles. The state of health model may be continually updated or retrained in a central processing unit based on operating variables of the vehicle batteries from the vehicle fleet.

The example above is representative of a multiplicity of stationary or mobile battery-operated machines and devices with a mains-independent energy supply, such as for example vehicles (electric vehicles, pedelecs, etc.), installations, machine tools, domestic appliances, IOT devices, a building energy supply, aircraft, in particular drones, autonomous robots and electronic entertainment devices, in particular cell phones, and the like, that are connected to a central processing unit (cloud) by way of an appropriate communication connection (e.g. LAN, Internet).

Figure 1:
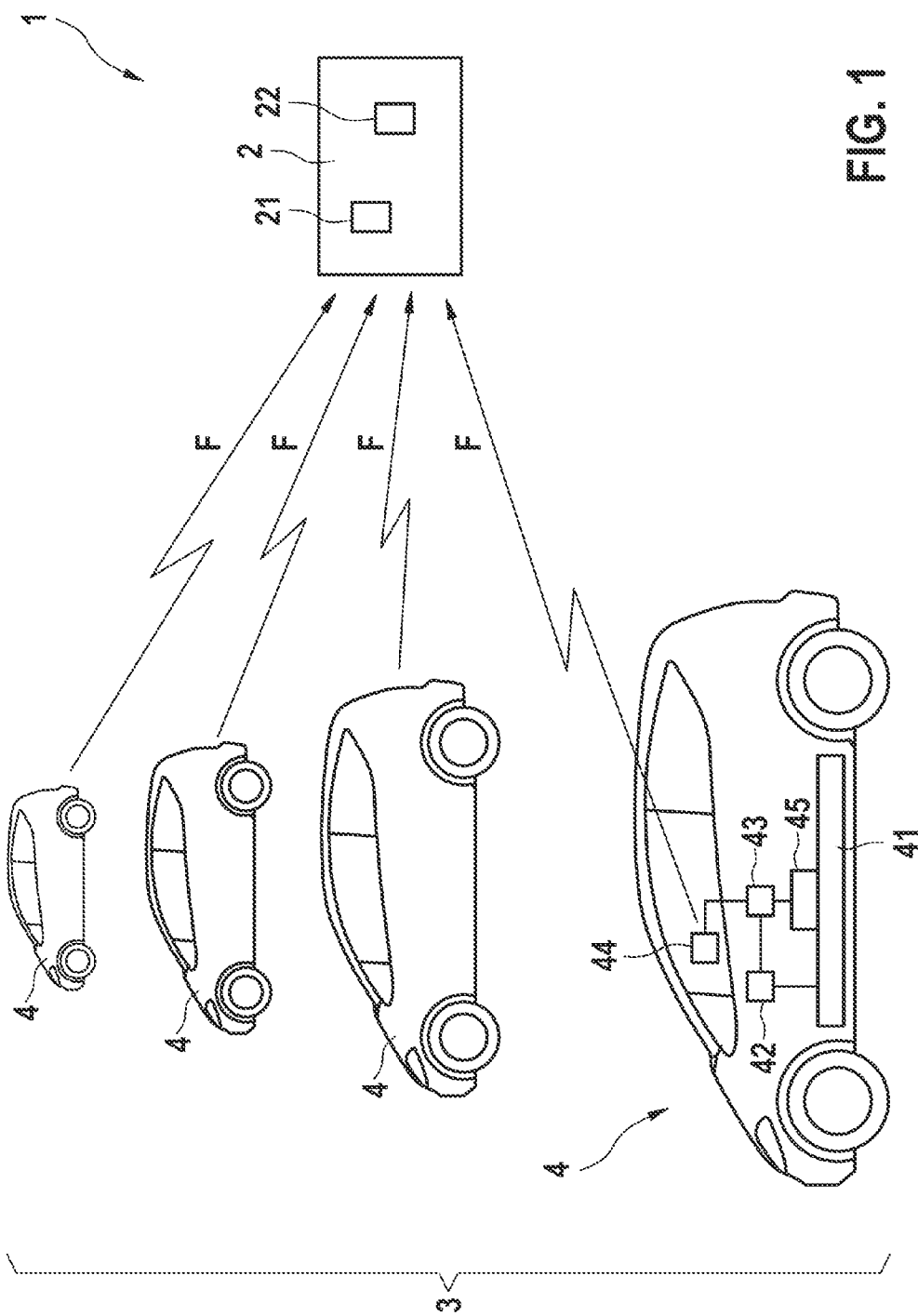
FIG. 1 shows a schematic illustration of a system for providing driver-specific and vehicle-specific operating variables with regard to the operation of a vehicle battery of vehicles of a vehicle fleet to a central processing unit.

FIG. 1 shows a system 1 for collecting fleet data in a central processing unit 2 for the purpose of creating and operating and also evaluating a state of health model. The state of health model is used to determine a state of health of an electrical energy storage unit, such as for example a vehicle battery or a fuel cell in a motor vehicle. FIG. 1 shows a vehicle fleet 3 with multiple motor vehicles 4. A characteristic of a state of health of a vehicle battery of a respective motor vehicle 4 of the vehicle fleet 3 is intended to be predicted in the central processing unit 2 based on the fleet data.

One of the motor vehicles 4 is illustrated in more detail in FIG. 1. The motor vehicles 4 each have a vehicle battery 41 as a rechargeable electrical energy storage unit, an electric drive motor 42 and a control unit 43. The control unit 43 is connected to a communication module 44 that is suitable for transferring data between the respective motor vehicle 4 and the central processing unit 2 (a so-called cloud). The control unit 43 is connected to a sensor unit 45 that has one or more sensors in order to continuously capture operating variables.

The motor vehicles 4 transmit the operating variables F, which at least indicate variables that influence the state of health of the vehicle battery, to the central processing unit 2. In the case of a vehicle battery, the operating variables F may indicate a present battery current, a present battery voltage, a present battery temperature and a present state of charge (SOC), and also at pack, module and/or cell level alike. The operating variables F are captured in a fast time frame of between 2 Hz and 100 Hz and may be transferred to the central processing unit 2 in uncompressed and/or compressed form on a regular basis. By way of example, the time series may be transferred to the central processing unit 2 in blocks at intervals of between 10 min and several hours.

The central processing unit 2 has a data processing unit 21, in which the method described below is able to be executed, and a database 22 for storing state of health characteristics of vehicle batteries of a multiplicity of vehicles 4 of the vehicle fleet 3.

The motor vehicles 4 transmit the operating variables F, which at least indicate variables that influence the state of health of the vehicle battery, to the central processing unit 2. In the case of a vehicle battery, the operating variables F may indicate a present battery current, a present battery voltage, a present battery temperature and a present state of charge (SOC). The operating variables F are captured in a fast time frame of between 2 Hz and 100 Hz, wherein their characteristics may be transferred to the central processing unit 2 in uncompressed and/or compressed form on a regular basis.

Operating features that relate to an evaluation period may be generated from the operating variables F in the central processing unit 2, or in other embodiments also in the respective motor vehicles 4 already. The evaluation period for determining the state of health may be between a few hours (for example 6 hours) and several weeks (for example one month). A customary value for the evaluation period is one week.

The operating features may for example comprise features referenced to the evaluation period and/or accumulated features and/or statistical variables ascertained over the entire previous service life. In particular, the operating features may for example comprise: Electrochemical states (layer thicknesses, concentrations, cyclizable lithium, etc.), histogram data for the state of charge characteristic, the temperature, the battery voltage, the battery current, in particular histogram data regarding the battery temperature distribution over the state of charge, the charging current distribution over the temperature and/or the discharge current distribution over the temperature, accumulated total charge (Ah), an average capacity increase during a charging process (in particular for charging processes in which the charge increase is above a threshold proportion (e.g. 20%) of the total battery capacity), a maximum for the differential capacity (dQ/dU: change of charge divided by change of battery voltage), and more.

Operating feature variables that relate to an evaluation period may be generated from the operating variables F in the central processing unit 2, or in other embodiments also in the respective motor vehicles 4 already. The evaluation period for determining the state of health may be between a few hours (for example 6 hours) and several weeks (for example one month). A customary value for the evaluation period is one week.

The operating features reveal further details: a temporal load pattern such as charging and driving cycles, determined by usage patterns (such as for example fast charging at high current levels or sharp acceleration or regenerative braking processes), a usage period for the vehicle battery, a charge accumulated over the operating time and a discharge accumulated over the operating time, a maximum charging current, a maximum discharge current, a frequency of charging, an average charging current, an average discharge current, a power throughput during charging and discharge, an (in particular average) charging temperature, an (in particular average) spread of the state of charge, and the like.

The state of health (SOH) is the key variable for indicating a remaining battery capacity or remaining battery charge. The state of health represents a degree of the aging of the vehicle battery or of a battery module or of a battery cell and can be indicated as a capacity retention rate (SOH-C) or as a rise in internal resistance (SOH-R). The capacity retention rate SOH-C is indicated as a ratio of the measured present capacity to an initial capacity of the fully charged battery. The relative change in internal resistance SOH-R rises as the battery ages.

A state of health model that is in particular fully or partially data-based is implemented in the central processing unit 2. The state of health model may be used on a regular basis, that is to say after the respective evaluation period has elapsed, to ascertain the present state of health of the vehicle battery 41 based on the operating features. In other words, it is possible to ascertain a state of health of the relevant vehicle battery 41 or of modules or cells belonging to this energy storage unit based on the operating features obtained from the operating variable characteristics of one of the motor vehicles 4 of the fleet 3.

Figure 2:
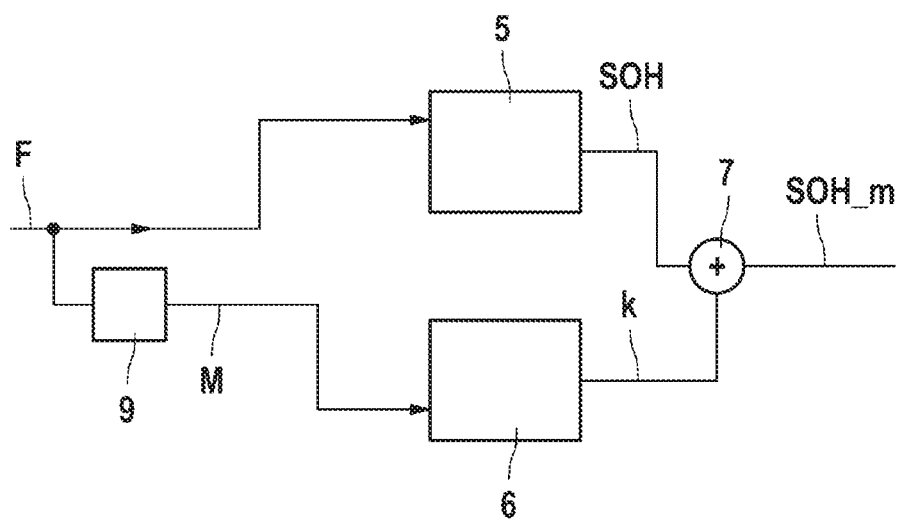
FIG. 2 shows a schematic illustration of a functional structure of a hybrid state of health model.

FIG. 2 schematically shows, by way of example, the functional structure of one embodiment of a data-based state of health model 9 that is structured in a hybrid manner. The state of health model 9 comprises a physical aging model 5 and a correction model 6. These obtain operating features M of a present evaluation period from a feature extraction block 8 based on the time series of the operating variables F. As an alternative, the operating variables F may also be incorporated directly into the physical state of health model 5, which is preferably implemented as an electrochemical or empirical model and describes corresponding electrochemical states, such as layer thicknesses of the active materials, change in the cyclizable lithium due to anode/cathode side reactions, structure of the solid electrolyte interface (SEI interface), slow consumption of electrolytes, loss of active material of the anode, loss of active material of the cathode, etc.), etc. using non-linear differential equations.

The physical aging model 5 corresponds to an electrochemical model of the battery cell and the cell chemistry. This model ascertains internal physical battery states on the basis of the operating variables F in order to provide a physically based state of health in the form of a capacity retention rate (SOH-C) and/or an internal resistance rate of rise (SOH-R). In such electrochemical modeling, $SOH_C$ and $SOH_R$ are calculated by ascertaining an electrochemical state vector that is ascertained using time integration methods.

The model values provided by the electrochemical model for the state of health SOH are however inaccurate in some situations, and provision is therefore made to correct these with a correction variable k. The correction variable k is provided by the data-based correction model 6 that is trained using training datasets from the vehicles 4 of the vehicle fleet 3 or laboratory data.

To determine a corrected state of health SOH_m, the outputs SOH, k of the physical aging model 5 and of the correction model 6, which is preferably implemented as a Gaussian process model, are applied to one another. These may in particular be added or multiplied (not shown) in a summing block 7 in order to obtain the corrected state of health SOH_m at a present evaluation period.

Other configurations of the data-based state of health model are likewise possible; for example, the data-based state of health model may be in the form of a non-hybrid, purely data-based model based on a probabilistic or on an artificial intelligence-based regression model, in particular a Gaussian process model, or a Bayesian neural network. This is trained to provide a state of health SOH from an operating feature point that is defined by present operating features M of a present evaluation period, wherein the operating features M are ascertained in a feature extraction block 8 based on the time series of the operating variables F.

Figure 3:
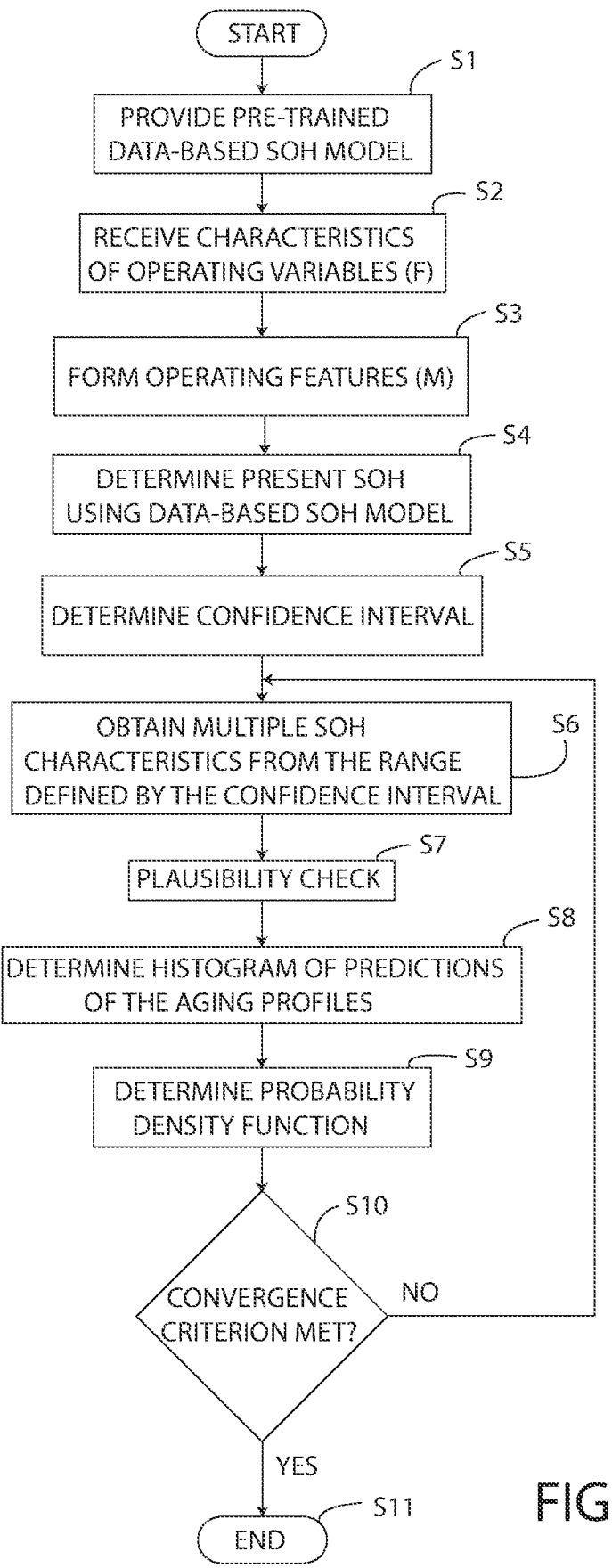
FIG. 3 shows a flowchart for illustrating a method for ascertaining a predicted state of health characteristic for a vehicle battery in a motor vehicle using a data-based state of health model.

FIG. 3 illustrates a flowchart that illustrates the sequence of a method for ascertaining a future characteristic of the state of health SOH for a particular vehicle 4 of the vehicle fleet 3 in the central processing unit 2. This makes it possible to estimate which state of health SOH is reached after which further operating time, and to estimate a remaining service life. The method may be implemented in parallel or successively for several or all of the vehicles 4 of the vehicle fleet 3 independently of one another.

The method is implemented in the data processing unit 21 in the central processing unit 2 and may be implemented there in the form of software and/or hardware.

In step S1, a pre-trained data-based state of health model, which is implemented as a purely data-based model or as a hybrid model as described above, is provided. The pre-trained data-based state of health model may be formed with a probabilistic regression model, in particular a Gaussian process model. The data-based state of health model is trained to provide a state of health of a vehicle battery for a present evaluation period on the basis of a characteristic of operating variables and/or an operating feature point.

In step S2, for a present operating period, characteristics of operating variables F, in particular characteristics of the battery current, the battery voltage, the battery temperature and the state of charge, are received from the particular vehicle.

In step S3, at least some of the above operating features M are formed from the operating variables F.

In step S4, a present state of health is ascertained by evaluating the data-based state of health model from the operating variable characteristics and/or the operating feature point formed by the operating features. The data-based state of health model furthermore makes it possible to indicate a degree of model inaccuracy for the modeled state of health.

In connection with the historical characteristic of the state of health of the vehicle battery 41 of the particular motor vehicle 4, a stored state of health characteristic is available in the central processing unit 2 from a time when the vehicle battery 41 is put into service to the end of the present evaluation period. The historical characteristic of the state of health of the vehicle battery 41 of the particular motor vehicle also stores the respective model inaccuracies of the model values of the characteristic of the respective state of health.

Temporal state of health characteristics of a multiplicity of vehicle batteries from further vehicles of the vehicle fleet 3 are additionally available in the central processing unit 2 for periods that extend from their respective time of putting into service (beginning of life) to the present evaluation period and beyond this or until the end of their service life.

In step S5, a confidence interval, dependent on the model inaccuracy, of between 1σ and 4σ in particular of for example +/−3σ, is ascertained from the historical characteristic of the state of health of the particular motor vehicle and the corresponding model inaccuracies for each evaluation period, wherein σ typically describes the standard deviation of a confidence interval, assuming a normal distribution. Non-normally distributed confidence intervals may in principle also be described.

Figure 4:
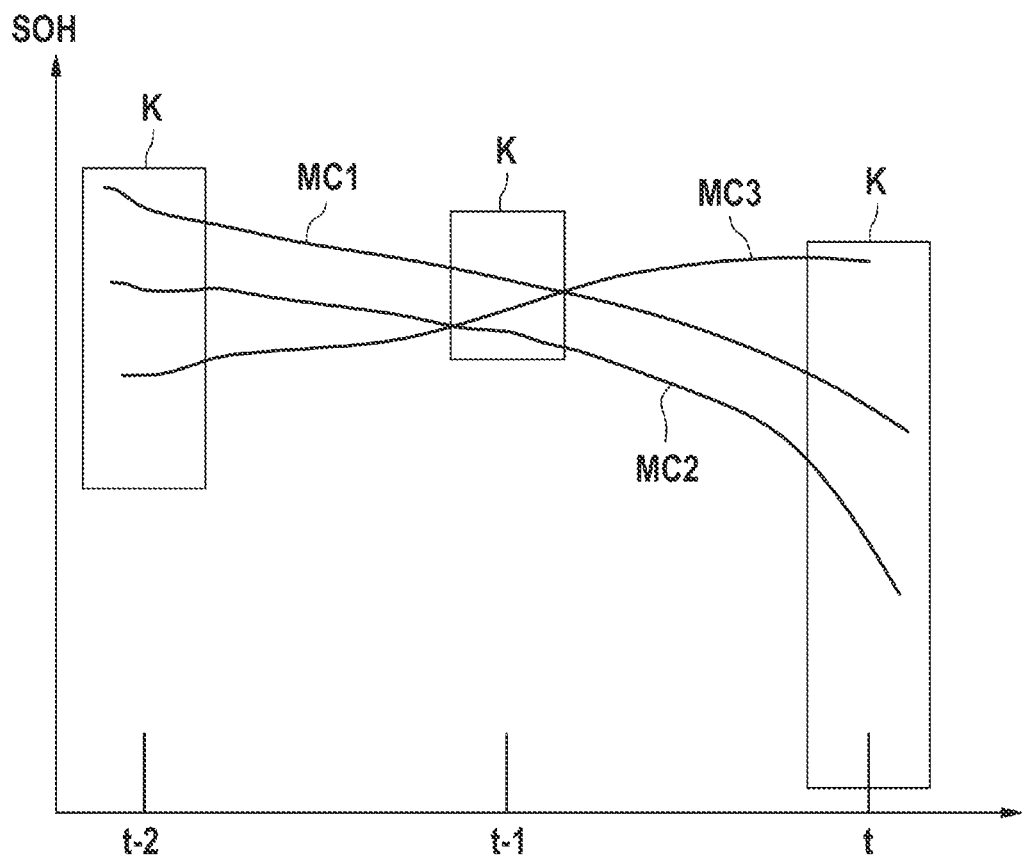
FIG. 4 shows an exemplary illustration of ascertaining state of health characteristic candidates using a Monte Carlo method.

In step S6, a Monte Carlo method is used to stochastically sample a predefined number of random state of health characteristics from the range defined by the confidence intervals, so as to obtain multiple state of health characteristic candidates. In the case of a Gaussian process model, sampling is performed from a normal distribution, with the standard deviation resulting from the data-based state of health model (GP). By way of example, a number of three, four or five or as many state of health characteristic candidates as desired may be ascertained, these indicating constructed state of health characteristics. These each have a temporal length that corresponds to the length from the time of the particular vehicle battery being put into service to the end of the present evaluation period. This procedure is illustrated for example in FIG. 4. For three successive evaluation periods t-2, t-1 and t (on the time axis, X-axis), it is possible to see confidence intervals K for the state of health characteristic of the particular vehicle battery. Three extracts consisting of random state of health characteristics, referred to as MC1, MC2 and MC3, run through the confidence intervals.

In step S7, the state of health characteristic candidates thus ascertained are checked for plausibility, and implausible state of health characteristics are removed. The constructed state of health characteristics MC1, MC2 and MC3 obtained using the Monte Carlo simulation may be checked for plausibility both on a model basis and on a rule basis. By way of example, those state of health characteristic candidates that have a rising state of health may be removed, since a rise in the state of health characteristic over increasing age of the vehicle battery is technically impossible and is thus implausible. In the example shown, the state of health characteristic candidate MC3 is discarded. The state of health characteristic candidates MC1 and MC2, on the other hand, are plausible and are used in a subsequent step.

In step S8, the database 22 of the central processing unit 2 is accessed. Real state of health characteristics of existing vehicle batteries are stored here. Consideration is preferably given to only those real state of health characteristics that have been recorded up to the end of the service life of the vehicle battery in question. If the vehicle for which the state of health is intended to be determined is considerably newer (namely specifically by at least the desired prediction horizon), incomplete state of health characteristics may also be considered. For the state of health characteristics that have been checked for plausibility, from the real state of health characteristics, the ones that have the greatest similarity to the ascertained state of health characteristic candidates are then selected. The similarity between the characteristics may preferably be defined on the basis of the temporal age, the covered overall distance or features typical for use (for example battery age, Ah throughput, mileage covered, etc.). The similarity is thus described by solving a one-dimensional or multidimensional optimization problem. This may be performed for example using a nearest neighbor method in which the overall deviation of a state of health characteristic from a state of health characteristic candidate is assessed.

For each possible trajectory, that is to say for example MC1, MC2 and MC3, the nearest neighbor algorithm is applied by solving an optimization problem in an at least 1-dimensional space. The nearest neighbor is preferably determined with minimization of the least squares, for example in the feature space: battery age, Ah throughput, mileage covered, etc. A number (for example 5) of the most similar vehicles 4 from the fleet 3 is additionally sought and a probability density is fitted using the ascertained nearest neighbors. A respective prediction is then possible for MC1, MC2 and MC3 through averaging and calculation of a standard deviation. Non-normally distributed probability densities may in principle also be considered here, for example using non-parametric methods.

The real state of health characteristics thus selected are added to an evaluation set of real state of health characteristics that are already available in the central processing unit 2 in a database. A predefined number of real state of health characteristics of vehicle batteries existing in the vehicle fleet may thereby be selected. In other words, the nearest neighbor prediction makes it possible to assign real state of health characteristics (that are temporally longer or extend to the end of the service life) from the database of the central processing unit to the state of health characteristic of the particular vehicle battery on the basis of the state of health characteristic candidates that have been checked for plausibility, these state of health characteristics coming as close as possible to the state of health characteristic of the particular vehicle battery. This thus results in a histogram of various possible and physically plausible predictions of the aging profile at each predicted time increment.

In step S9, a probability density function regarding the real state of health characteristics contained in the evaluation set is calculated by combining all of the histograms calculated in step S8 through addition in each predicted time increment and performing a new fit of the probability density function. Non-normally distributed distributions may in principle also be mapped here, for example using non-parametric density estimators. In this regard, the probability density function is also calculated for the expected remaining service life of the energy storage unit. This results in a characteristic of an average of a state of health with a corresponding confidence interval that indicates a respective degree of the prediction uncertainty for the predicted states of health as a quantified uncertainty.

In step S10, it is checked whether a convergence criterion is met. This convergence criterion is advantageously linked to the end of the service life of the energy storage unit to be predicted. The convergence criterion may relate to the confidence interval and, starting from the second iteration, check whether a change in the size of the confidence interval characteristic is less than a predefined threshold value. If the change in the size of the confidence interval (preferably for multiple iterations, for example 10 times) is lower than the threshold value (alternative: Yes), then the method is ended at step S11. In step S11, a characteristic of the average of the state of health of the last obtained probability density function is provided as predicted characteristic of the state of health of the particular vehicle battery. Otherwise (alternative: No), the method continues with step S6.

The state of health characteristic thus predicted is then assigned as the state of health characteristic to be assigned to the particular energy storage unit of the motor vehicle. The predicted state of health characteristic may then be used to ascertain a remaining service life with statistical uncertainty quantification and to use or to signal this in another way in subsequent methods for outputting driving recommendations. It may in particular be signaled to exchange the vehicle battery upon reaching a remaining service life of zero when a certain probability is exceeded. This probability is calculated through integration over the probability density function with respect to the remaining service life. A definition of the end of service life (for example SOH=0.7) is preferably taken into consideration here. By way of example, the 50% quantile, that is say the median, may be applied for this purpose when exactly this limit value is exceeded in the prediction.

What is claimed is:

1. A method for determining a predicted state of health of an electrical energy storage unit in a machine, comprising:
   providing a data-based or hybrid state of health model, the state of health model is trained, depending on operating variables of the electrical energy storage unit and/or operating features derived from the operating variables, to indicate a state of health and to indicate a model uncertainty of the indicated state of health;
   ascertaining a state of health characteristic and an associated model uncertainty of the energy storage unit of the machine based on the operating variables using the state of health model with a data processing device operably connected to the machine and located remote from the machine;
   defining characteristic of confidence intervals for the state of health of the energy storage unit of the machine;
   generating at least one random constructed state of health characteristic candidate that corresponds to constructed state of health characteristics within the defined characteristic of confidence intervals using the data processing device;
   checking the at least one random constructed state of health characteristic candidate for plausibility on a rule basis to identify each random constructed state of health characteristic as (i) at least one plausible state of health characteristic candidate, or (ii) at least one implausible state of health characteristic candidate,
   selecting, from a plurality of provided real state of health characteristics of real energy storage units of other machines, a number of the real state of health characteristics that are closest to the at least one plausible random constructed state of health characteristic candidate using the data processing device;
   ascertaining a probability density function of the selected number of real state of health characteristics in order to determine a characteristic of the average of the state of health as a predicted state of health characteristic using the data processing device;
   signaling the predicted state of health characteristic; and
   operating the machine based on the predicted state of health characteristic of the electrical energy storage unit,
   wherein the rule basis includes identifying the at least one random constructed state of health characteristic candidate as being implausible when the at least one random constructed state of health characteristic candidate shows an increase in the state of health over an evaluation period, and
   wherein the at least one implausible state of health characteristic candidate is not taken into consideration for ascertaining the probability density function.

2. The method according to claim 1, wherein:
   generating the at least one random constructed state of health characteristic candidate and the selecting the number of the real state of health characteristics are performed multiple times,
   the selected real state of health characteristics are each added to an evaluation set, and
   the probability density function is ascertained based on the selected real state of health characteristics of the evaluation set.

3. The method according to claim 2, wherein:
   generating the at least one random constructed state of health characteristic candidates and the selecting the number of the real state of health characteristics are performed until a convergence criterion is met,
   the convergence criterion depends on an overall confidence that results from a characteristic of a variance or a standard deviation of the probability density function, and
   the convergence criterion depends on a change in an overall confidence in successive run-throughs of the generation and the selection.

4. The method according to claim 1, wherein:
   the selection of the number of the real state of health characteristics that are closest to the at least one random constructed state of health characteristic candidate is performed using a nearest neighbor method, a least squares method, in a multidimensional operating feature space, and/or with respect to temporal or usage-dependent characteristic of the respective state of health characteristic candidates.

5. The method according to claim 1, wherein the predicted state of health characteristic is transferred to the battery-operated machine from the data processing device.

6. The method according to claim 1, wherein the predicted state of health characteristic is used to ascertain a remaining service life with a statistical uncertainty quantification and to use or to signal the remaining service life in subsequent methods for outputting operating recommendations.

7. The method according to claim 1, wherein:
the predicted state of health characteristic is used to signal an exchange of the electrical energy storage unit upon reaching a remaining service life of zero when a prediction uncertainty falls below a predefined uncertainty threshold, and
the prediction uncertainty is calculated through integration over the probability density function with respect to the remaining service life.

8. The method according to claim 1, wherein the probability density function is ascertained by adding histograms of states of health, ascertained at each evaluation time, of the selected real state of health characteristics.

9. The method according to claim 1, wherein the electrical energy storage unit is used to operate a machine, a motor vehicle, a pedelec, an aircraft, a drone, a machine tool, a consumer electronics device, a cell phone, an autonomous robot, and/or a domestic appliance.

10. The method according to claim 1, wherein a computer program product comprises instructions that, when the computer program product is executed by at least one data processing device, cause the at least one data processing device to perform the method.

11. The method according to claim 10, wherein the computer program product is stored on a non-transitory machine-readable storage medium.

12. A device for determining a predicted state of health of an electrical energy storage unit in a battery-operated machine, comprising:
at least one data processing device configured to:
provide a data-based or hybrid state of health model, the state of health model is trained, depending on operating variables of the electrical energy storage unit and/or operating features derived from the operating variables, to indicate a state of health and to indicate a model uncertainty of the indicated state of health;
ascertain a state of health characteristic and an associated model uncertainty of the energy storage unit of the machine based on the operating variables using the state of health model;
defining characteristic of confidence intervals for the state of health of the energy storage unit of the machine;
generate at least one random constructed state of health characteristic candidate that corresponds to constructed state of health characteristics within the defined characteristic of confidence intervals;
check the at least one random constructed state of health characteristic candidate for plausibility on a rule basis to identify each random constructed state of health characteristic as (i) at least one plausible state of health characteristic candidate, or (ii) at least one implausible state of health characteristic candidate,
select, from a plurality of provided real state of health characteristics of real energy storage units of other machines, a number of the real state of health characteristics that are closest to the at least one plausible random constructed state of health characteristic candidate;
ascertain a probability density function of the selected number of real state of health characteristics in order to determine a characteristic of the average of the state of health as a predicted state of health characteristic; and
signal the predicted state of health characteristic,
wherein the battery-operated machine is operated based on the predicted state of health characteristic of the electrical energy storage unit,
wherein the rule basis includes identifying the at least one random constructed state of health characteristic candidate as being implausible when the at least one random constructed state of health characteristic candidate shows an increase in the state of health over an evaluation period, and
wherein the at least one implausible state of health characteristic candidate is not taken into consideration for ascertaining the probability density function.

13. The method according to claim 1, wherein operating the machine based on the predicted state of health characteristic comprises:
exchanging the electrical energy storage unit for another electrical energy storage unit upon reaching a remaining service life of zero of the electrical energy storage unit when a prediction uncertainty falls below a predefined uncertainty threshold,
wherein the prediction uncertainty is calculated through integration over the probability density function with respect to the remaining service life.

14. The method according to claim 1, wherein:
the characteristic of confidence intervals are defined based on a historical state of health characteristic and an associated model uncertainty of the historical state of health characteristic of the energy storage unit of the machine, and
the historical state of health characteristic is generated before the ascertained state of health characteristic.

15. The method according to claim 1, wherein the plurality of provided real state of health characteristics are recorded from real energy storage units up to an end of a service life of the real energy storage units.

* * * * *